United States Patent [19]

Giallorenzi et al.

[11] 4,376,248
[45] Mar. 8, 1983

[54] FIBER OPTICAL MAGNETIC FIELD SENSOR USING MAGNETOSTRICTIVE MATERIAL

[75] Inventors: Thomas G. Giallorenzi, Springfield; George H. Sigel, Jr., Great Falls, both of Va.

[73] Assignee: The United States of America as represented by the Secretary of the Navy, Washington, D.C.

[21] Appl. No.: 241,290

[22] Filed: Mar. 6, 1981

[51] Int. Cl.³ .............................................. G02B 5/14
[52] U.S. Cl. ....................................... 250/227; 324/96
[58] Field of Search ............... 324/96, 244; 350/96.24, 350/96.29, 96.30, 96.31, 375–378, 355; 332/7.51; 250/227, 231 R

[56] References Cited

U.S. PATENT DOCUMENTS 3,645,603  2/1972  Smith ................................ 350/96.29
3,701,131  10/1972  Brauser et al. ..................... 250/227
4,147,979  4/1979  Baves et al. ......................... 324/244
4,348,587  9/1982  Tangonan et al. .................. 250/227

OTHER PUBLICATIONS

"Magnetic Field Sensing with a Single-Mode Fiber" by Raleigh, Optics Letters, vol. 6, No. 1, Jan. 1981, pp. 19–21.

*Primary Examiner*—David C. Nelms
*Attorney, Agent, or Firm*—Robert F. Beers; William T. Ellis; Kenneth E. Walden

[57] ABSTRACT

A sensing element of magnetostrictive material associated with an optical fiber of an interferometer arm defining apparatus for detecting magnetic fields. The magnetostrictive material is adhered in close co-extensive adjacency with the optical fiber and in the presence of a magnetic field undergoes responsive longitudinal dimension changes which strains the optical fiber and induces a strain related phase shift in an optically propagating beam in the fiber detectable by interferometry.

17 Claims, 5 Drawing Figures

FIBER OPTICAL MAGNETIC FIELD SENSOR USING MAGNETOSTRICTIVE MATERIAL

BACKGROUND OF THE INVENTION

Optical fiber sensors are being pursued in developments for sensing a variety of physical parameters including acoustic pressure, temperature, magnetic fields, acceleration and rate of rotation. Optical fiber devices are known in the patented literature for measuring electric current in a conductor by passing light through an optical fiber disposed in the magnetic field surrounding the conductor. Such devices have commonly employed the principle known as the Faraday effect where a beam of plane polarized light propagating longitudinally through an optical fiber in the presence of a magnetic field is caused to rotate (twist) about its longitudinal axis to an extent dependent upon its path length and magnitude of the magnetic field. The extent of rotation is proportional to the current carried by the conductor.

Presently used methods of detecting perturbations in the earth's magnetic field require cryogenic temperatures for increased sensitivity. Obviously, this involves complex supporting apparatus and high operating costs.

The possibility of detecting weak magnetic fields by magnetostrictive perturbations of optical fibers was proposed in Optics Letters, Vol. 5, No. 3, March 1980. An invention according to that idea discussed therein is covered in U.S. Patent application Ser. No. 223,635 filed Jan. 9, 1981 entitled "Magnetostrictive Optical Fiber Cable and Magnetic Field Detector and Method Thereof". That invention relates to providing a magnetostrictive metal in direct physical contact with a light transmitting optical fiber cable for effecting light transmission through the cable in response to a magnetic field. Tests conducted in the proposed detection scheme as well as other arrangements are reported by the authors in Electronics Letters, May 22, 1980, Vol. 16, No. 11, pp. 408-409. The basic principle of that sensor's operation is associated with the measurement of longitudinal strain induced in an optical fiber by a magnetostrictive material. Direct physical contact between a magnetostrictive metal jacket and the optical fiber may interfere with the glass surface and causes light transmission losses.

In order to strain a longitudinal section of the fiber to change its optical path length for increased sensitivity, it is desirable that the surrounding jacket have a high magnetostrictive constant and thick walls which cover a substantial length of the optical fibers. Unfortunately, these desirable characteristics are not possible in one embodiment. Flexibility of the fibers, for example, is greatly reduced. Direct application of the metal to the optical fiber surface if not done properly destroys the surface integrity of the fiber (either core or cladding) resulting in light leakage. Furthermore bending of a metal jacket which has been applied directly to the optical fiber induces optical losses in the fiber known as microbending losses. As the jacket is conformed, surface strains change the refractive index and undulations are induced in the fiber surface. These conditions interfere with light transmission and causes leakage. These and other shortcomings present in the prior art are overcome by the present invention.

SUMMARY OF THE INVENTION

The present invention relates to a single mode optical fiber arranged coextensive with and secured to magnetostrictive material, such as nickel or metallic glass. In the presence of a magnetic field the magnetostrictive material undergoes longitudinal dimension changes to strain the optical fiber and change its optical path length to cause a related phase shift in light propagating therethrough. This phase shift is detectable by interferometry More specifically, the magnetostrictive material is secured to the optical fiber cladding by a suitable bonding material in a manner or by process providing improved performance of the detection apparatus.

While the magnetostrictive jacket may be magnetically biased for operation in a more sensitive range, it is advantageous that the magnetostrictive material (jacket) be annealed prior to assembly for enhancing its change in length ($\Delta L$) per change in magnetic field (H). Annealing is not possible in prior arrangements.

OBJECTS OF THE INVENTION

Therefore, it is an object of the invention to provide and improve optical fiber magnetic field sensor and method of manufacture.

It is another object of the invention to provide an optical fiber with a coextensive length of magnetostrictive material adhered thereto and method of assembly for defining apparatus for detecting and measuring magnetic fields.

It is still another object of this invention to provide a coextensive optical fiber and magnetostrictive material and improved method for securing them together.

Further objects of the invention and method will be revealed in the specification, drawings and claims herein.

DESCRIPTION OF THE PREFERRED EMBODIMENT

Figure 1:
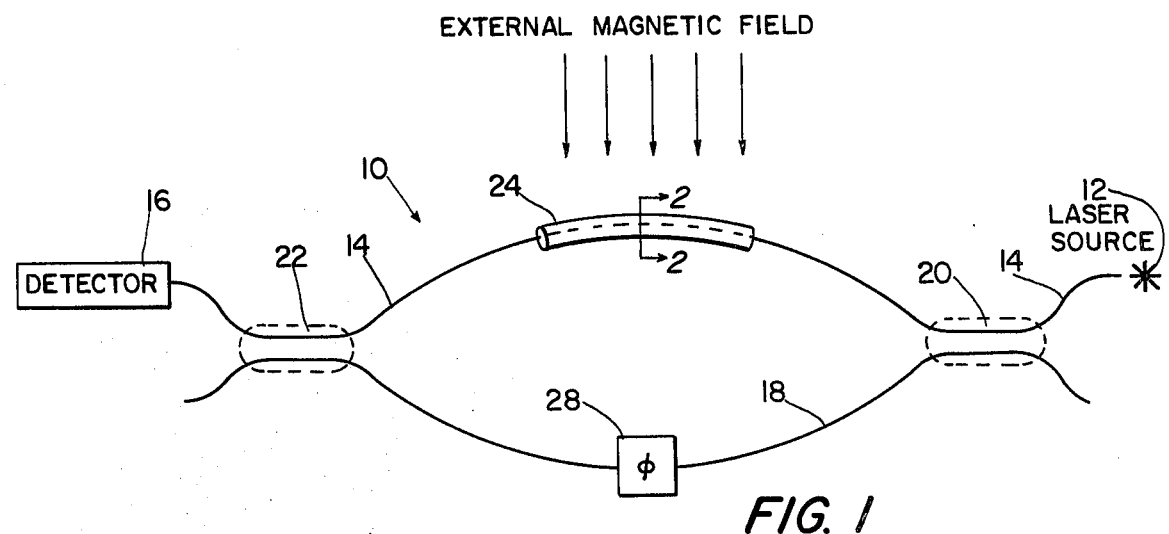
FIG. 1 is an optical fiber Mach-Zehnder interferometer employing one form of a sensing arm constructed according to the present invention.
Figure 3:
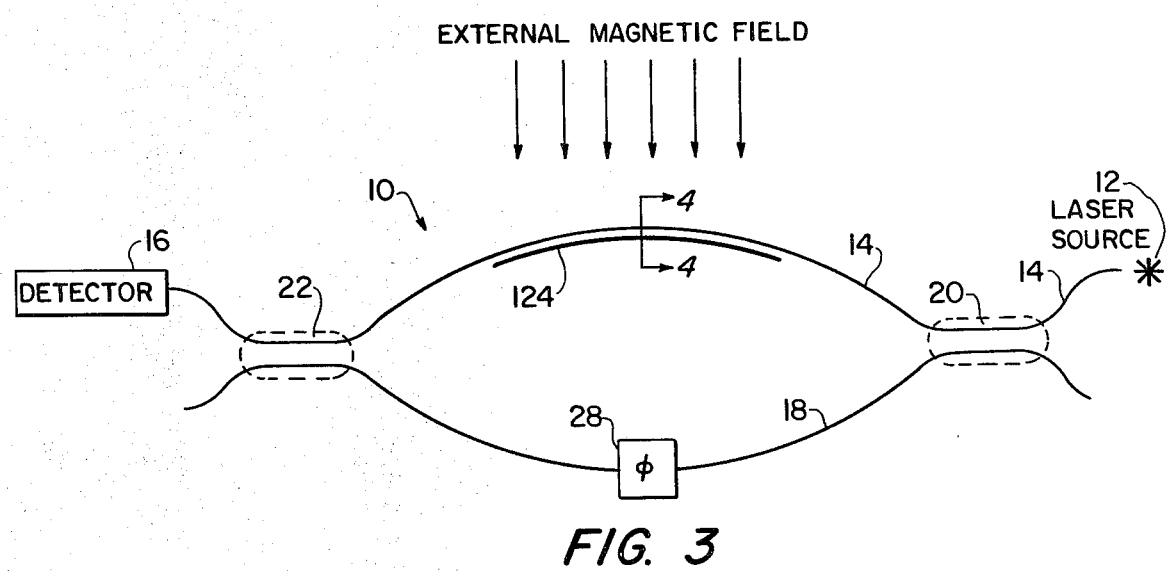
FIG. 3 is another optical fiber Mach-Zehnder interferometer similar to that shown in FIG. 1 employing another form of sensing element constructed according to the present invention.

Referring now to the drawings wherein like reference numerals are applied to like or similar elements, there is shown in FIGS. 1 and 3 representations of optical interferometers having sensing arms formed according to the present invention. These arrangements each provide an optical fiber Mach-Zehnder interferometer designated generally by the number 10. Each includes a laser source 12 providing light which is coupled into one end of a single mode optical fiber 14 and transmitted therethrough to detector 16 at some length therefrom. The detector senses the light and any variations therein due to the influence of an external magnetic field. Optical fiber 14 defines the sensing arm of the interferometer and is adapt to be arranged for exposure to the external magnetic fields as indicated in the drawings. Another optical fiber 18, defining a reference arm, is coupled into optical fiber 14 by means of a pair of spaced bottle couplers 20 and 22. Laser light initially introduced into optical fiber 14 is shared equally by optical fiber 18 by a common evanescent field coupling, and coherent light of the same magnitude and wavelength now propagates through each of the interferometer arms. Reference may be made to U.S. Pat. No. 4,264,126 for a disclosure of this type of evanescent field coupling. Optical fiber 18, defining the reference arm, is not patently exposed to the magnetic field. It may be provided with a modulator for selectively shifting the phase of lights therethrough.

The sensing arm is provided with arrangements according to this invention to render it more sensitive to the presence of an external magnetic field. In the FIG. 1 embodiment, a length of a wire-like cylinder of magnetostrictive material, such as nickel, is received around and secured to optical fiber 14.

Figure 2:
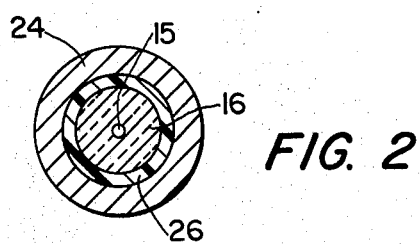
FIG. 2 is a greatly enlarged cross-sectional view taken generally along line 2—2 of FIG. 1.

A cross-sectional view of the sensing arm is shown in FIG. 2. Optical fiber 14, comprising core 15 and cladding 16, is received inside sleeve 24 and is maintained generally coaxial therein by a bonding material 26 such as an epoxy resin. Any change in the longitudinal dimension of the sleeve is transmitted as strain to the optical fiber, and this changes the optical path length of light passing therethrough. While the bonding material when cured defines a substantially rigid material, it is provided with a slight resilience whereby when the sensing arm is curved or bent it protects the surface of the optical fiber from surface microbends such as would occur at a direct glass-metal interface.

Wire-sleeve 24 is formed of a material having a high magnetostrictive constant (properly applied and heat treated). The sleeve preferably has an outside diameter substantially greater than the opening therethrough. Its outside diameter may be as large as 0.1 to 3 mm, whereas its axial opening must be of a size sufficiently large to receive optical fiber 14 (approximately 50-100 $\mu$m) over which has been applied a bonding material 26 approximately 5 $\mu$m thick.

Figure 4:
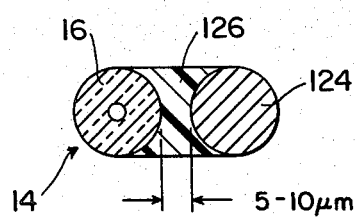
FIG. 4 is a greatly enlarged cross-sectional view taken generally along line 4—4 of FIG. 3 for showing one embodiment thereof.
Figure 5:
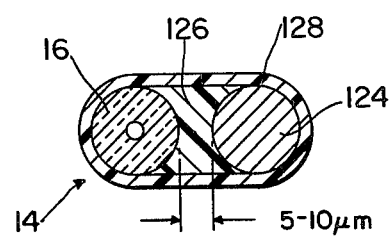
FIG. 5 is another greatly enlarged cross-sectional view taken generally along line 4—4 of FIG. 3, but showing an altered embodiment thereon.

In the FIG. 3 embodiment, which is substantially identical to the interferometer arrangement disclosed in FIG. 1, a wire of magnetostrictive material 124 is disposed in spaced-apart co-extensive adjacency with optical fiber 14. Bonding material such as epoxies, resins, cements and glass to metal seals may be used to secure the optical fiber and wire together along their co-extension. In this case, as illustrated in FIG. 4, a relatively rigid bonding material 126 is desired only between cladding 16 of the optical fiber and wire 124, and the amount of the material, if any, surrounding them should be minimal so as not to interfere with magnetostrictive elongation. If desired a more flexible coating 128 (approximately 5 $\mu$m thick) may be applied directly over the optical fiber-wire bonded structure. The optical fiber and wire, as illustrated in FIGS. 4 and 5, are spaced apart approximately 5-10 $\mu$m. While the bonding material therebetween is generally rigid, it presents slight resiliency at the optical fiber-wire interface. Upon bending of the wire, the optical fiber surface is refrained from distortion as it would be if the metal wire and optical fiber surfaces were in direct contact. One of the advantages of the coextensive optical fiber and magnetostrictive wire arrangements as illustrated in FIGS. 3 and 4 is that the optical fiber and wire may be fabricated independently. The bonding process may be readily performed simultaneously with the drawing of the fiber, or the optical fiber and wire may be drawn together through a path of the bonding material. They may be easily fabricated in coextensive lengths of up to several kilometers. When the sensing arms, as shown in FIGS. 1 and 3, are exposed to an external magnetic field the magnetostrictive material, either in the form of a sleeve or wire, undergo related longitudinal dimension changes (lengthens) to strain the optical fiber which changes the optical path length whereby light in passing through the optical fiber has its phase shifted. The fiber defining reference arms 18 does not have its optical pathlength changed and light passing through it does not experience a corresponding phase shift. The interferometer combines these two light waves and their combined amplitude variations are sensed by detector 16. Optical fiber 18 is provided with a phase shifter 28 adapted for selectively shifting or modulating the phase of light passing through the reference arm for correlation with the magnetic field induced phase shift in the sensing arm. The lengths of optical fibers defining the arms are preferably substantially identical. Fiber 18 forming the reference arm is preferably either isolated from or is not sensitive to a magnetic field.

The sensitivity of the sensing arm is increased by the length and size of the magnetostrictive jacket or wire. However, a large diameter jacket induces eddy currents and reduces the flexibility of the arm. Furthermore, it may be difficult to assemble on the wire a magnetostrictive jacket of longer than about 1 meter. The sensing arm may be formed into any antenna arrangement with the reference arm entirely disassociated therewith and disposed outside the magnetic field. In the alternative, both arms may be formed into the antenna arrangement in side by side position when the reference arm is relatively insensitive to a magnetic field.

There has been illustrated and described preferred embodiments of the present invention. It will be appreciated that numerous changes and modifications can be made thereto without departing from the spirit of the invention which is covered by and limited only by the scope of the claims annexed hereto.

What is claimed and desired to be secured by Letters Patent of the United States is:

1. A sensing arm of an interferometer for detecting a magnetic field comprising:

a length of optical fiber having a single mode optical core surrounded by cladding;

a length of magnetostrictive material disposed in space apart coextensive adjacency with the optical fiber;

means between and adhering to each the optical fiber and magnetostrictive material for bonding them together and maintaining their spacing substantially throughout their coextensive lengths;

whereby the magnetostrictive material in the presence of a magnetic field undergoes longitudinal dimension changes related to the strength of the magnetic field to strain the optical fiber and change its optical path length to induce strain related phase shifts in light propagating therethrough which is detectable by interferometry;

said bonding means having a coefficient of thermal expansion substantially equal to that of the optical fiber and being slightly resilient thereby permitting limited bending of the magnetostrictive material without causing distortions of the surface of the optical fiber for minimizing microbending losses therein.

2. The invention according to claim 1 wherein the magnetostrictive is metal.

3. The invention according to claim 1 wherein the magnetostrictive material selected from the group consisting of nickel, permalloy, ferro compounds and ferri compounds.

4. The invention according to claim 1 wherein the length of magnetostrictive material is an annealed nickel wire about 1-2 kilometers in length disposed generally parallel with the optical fiber.

5. The invention according to claim 4 wherein the wire has an outside diameter substantially equal to the outside diameter of the optical fiber cladding.

6. The invention according to claim 5 where the diameters are each in the range of 50 to 100 $\mu$m.

7. The invention according to claim 4 or 5 further including a relatively flexible coating covering the fiber-wire bonded structure.

8. The invention according to claim 1, 2 or 3 further defined by the magnetostrictive material comprising an annealed magnetostrictive sleeve having a longitudinal opening therethrough of sufficient size to coaxially receive the optical fiber and an intermediate layer of bonding material.

9. The invention according to claim 8 wherein the sleeve has an outside diameter of around 0.1-0.3 mm and the longitudinal opening therethrough of around 60 to 120 $\mu$m.

10. The invention according to claim 8 wherein the sleeve is bonded to cladding of the cladding fiber.

11. A method of assembling a magnetostrictive sleeve about an optical fiber for use as a sensing arm of an optical fiber interferometer comprising the steps of:
selecting a length of optical fiber;
selecting a length of magnetostrictive metal sleeve having an axial opening therethrough with a diameter larger than that of the optical fiber;
coating the optical fiber with an epoxy resin; and
threading the coated optical fiber through the sleeve opening and allowing the resin to cure thereby securing the optical fiber within the sleeve opening and spaced from walls thereof along a substantially portion of their coextensive lengths.

12. The method according to claim 11 further defined by selecting nickel as the magnetostrictive metal sleeve.

13. The method according to claim 11 or 12 further defined by:
selecting the length of optical fiber having an optical core covered by cladding with an outside diameter of from around 50 to 100 $\mu$m;
selecting the length of annealed magnetostrictive wire having an outside diameter of around 0.1 to 0.3 mm and a coaxial opening therethrough of from 60 to 120 $\mu$m;
providing a curable epoxy layer several microns thick between the surfaces of the optical fiber and opening wall.

14. The method according to claim 13 further defined by selecting an epoxy resin which sets to a consistency having a slight resilience.

15. A sensing arm for an optical fiber interferometer for use in detecting magnetic fields comprising:
a single mode optical fiber of around 0.5 to 1 kilometer in length;
a substantially equal length of magnetostrictive metal wire;
said optical fiber and wire bonded together in spaced parallelism over substantially their coextensions thereby defining a sensing arm for the interferometer;
whereby in the presence of a magnetic field the wire undergoes longitudinal dimension changes to strain the optical fiber and induce detectable strain related phase shifting in light propagating through the optical fiber in comparison to light from a common laser source propagating through an optical fiber defining a reference arm of the interferometer;
said wire and bonding having thermal expansion characteristics substantially matching that of the optical fiber so that under changing environmental temperature no substantial strain is induced in the optical fiber sensing arm thereby minimizing thermally induced phase shifts in light propagating therethrough.

16. The invention according to claim 15 wherein the magnetostrictive wire is nickel.

17. The invention according to claim 15 or 16 wherein a flexible material jackets the outer periphery of the sensing arm.

* * * * *